United States Patent
Lee et al.

(10) Patent No.: US 8,007,963 B2
(45) Date of Patent: Aug. 30, 2011

(54) PHOTOMASK

(75) Inventors: Myoung-soo Lee, Suwon-si (KR);
Young-su Sung, Chuncheon-si (KR);
Sang-gyun Woo, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/639,155

(22) Filed: Dec. 16, 2009

(65) Prior Publication Data

US 2010/0173230 A1 Jul. 8, 2010

(30) Foreign Application Priority Data

Jan. 7, 2009 (KR) ........................ 10-2009-0001244

(51) Int. Cl.
*G03F 1/00* (2006.01)
(52) U.S. Cl. ........................................... 430/5
(58) Field of Classification Search ............... 430/5, 321, 430/394; 378/35
See application file for complete search history.

(56) References Cited

U.S. PATENT DOCUMENTS

| | | | | |
|---|---|---|---|---|
| 5,480,747 | A | * | 1/1996 | Vasudev ........................ 430/5 |
| 7,666,556 | B2 | * | 2/2010 | Jung ............................ 430/5 |
| 2008/0020291 | A1 | | 1/2008 | Lu |
| 2009/0111034 | A1 | * | 4/2009 | Kim ............................ 430/5 |

FOREIGN PATENT DOCUMENTS

| | | |
|---|---|---|
| JP | 2002-011589 | 1/2002 |
| KR | 1020080001441 A | 1/2008 |
| KR | 1020080001475 A | 1/2008 |

* cited by examiner

*Primary Examiner* — Stephen Rosasco

(74) *Attorney, Agent, or Firm* — Volentine & Whitt, PLLC

(57) ABSTRACT

A photomask or equivalent optical component includes a scattering element in the medium of a substrate, which actively modifies (adjusts/filters the intensity, shape, and/or components of) light that propagates through the substrate. The substrate has a front surface and a back surface and is transparent to exposure light of a photolithography process, i.e., light of given wavelength, at least one mask pattern at the front surface of the substrate and the image of which is to be transferred to an electronic device substrate in a photolithographic process using the photomask, a blind pattern at the front surface of the substrate and opaque to the exposure light, and the scattering element. The scattering element, in addition to being formed in the medium of the substrate, is situated below the blind pattern as juxtaposed with the blind pattern in the direction of the thickness of the substrate. Also, a section of the photomask substrate is irradiated with energy which does not melt and/or vaporize the medium of the photomask substrate to form the scattering element. To this end, a femtosecond laser may be used.

20 Claims, 5 Drawing Sheets

PHOTOMASK

CROSS-REFERENCE TO RELATED APPLICATIONS

This application claims the benefit of Korean Patent Application No. 10-2009-0001244, filed on Jan. 7, 2009, in the Korean Intellectual Property Office.

BACKGROUND

The present inventive concept relates to photolithographic exposure equipment used in the manufacturing of semiconductor devices, LCDs and the like. More particularly, the present inventive concept relates to a photomask of photolithographic exposure equipment.

The manufacturing of electronic and optical devices, such as semiconductor devices and LCDs, includes a photolithography process in which the image of a very fine pattern such as a circuit pattern is transferred from a photomask to a substrate of the device under manufacture. An example of the substrate is a semiconductor wafer. To this end, exposure equipment is used. The exposure equipment is made up of several optical systems and thus, the equipment must possess high a degree of resolution to focus a precise image of the pattern of the photomask onto the wafer. Moreover, this process of transferring a pattern to a wafer is repeated many times on different areas (referred to as "shots") of the wafer during a mass production process of, for example, manufacturing semiconductor chips. Therefore, various optical components, such as the photomask, a lens, and an aperture, etc., of the optical systems must offer a high degree of optical performance on a consistent and regular basis so that a critical dimension (CD) of a pattern in a particular shot is uniform and the CD is uniform from shot to shot.

The photomask is an optical component that bears the pattern whose image is to be transferred to the substrate of the electronic/optical device under manufacture. In addition, the photomask may have other patterns such as a blind pattern that enhances the precision of the optical transfer of the image to the substrate. A pellicle is attached to the photomask to protect the photomask. Furthermore, the maintaining of photolithographic exposure equipment entails cyclically removing the pellicle attached to the photomask, cleaning the photomask, and attaching a new pellicle to the photomask. Over time, however, such procedures reduce the thickness of the blind pattern of the photomask. In this case, the transmittance of the photomask increases, which causes a drop in shot uniformity on the wafer or other substrate.

SUMMARY

According to an aspect of the inventive concept, there is provided a photomask comprising a photomask substrate having a front surface and a back surface and transparent to exposure light of a given wavelength, at least one mask pattern on the front surface of the photomask substrate, a blind pattern extending along the periphery of the photomask substrate on the front surface of the photomask substrate and opaque to the exposure light, and a light scattering element encapsulated in the medium of the photomask substrate. The mask pattern is the pattern whose image is to be transferred to a substrate of a device being manufactured by using the photomask in a photolithography process. The light scattering element is juxtaposed with the blind pattern in the direction of the thickness of the photomask substrate, and is configured to modify, e.g., reduce the intensity of, the exposure light that is incident on the back surface of the photomask as the incident exposure light propagates to the front surface of the photomask.

According to an aspect of the inventive concept, there is provided an optical component of photolithographic exposure equipment, comprising a substrate having a front surface and a back surface and transparent to exposure light of a given wavelength, at least one mask pattern adjacent the front surface of the transparent substrate, a blind pattern extending alongside an outer peripheral part of the optical component adjacent the front surface of the transparent substrate and opaque to the exposure light, and a light scattering element encapsulated in the medium of the transparent substrate. The mask pattern is the pattern whose image is to be transferred to a substrate of a device being manufactured by using the photolithographic exposure equipment. The light scattering element is juxtaposed with the blind pattern in the direction of the thickness of the transparent substrate, and is configured to modify, e.g., reduce the intensity of, the exposure light that is incident on the back surface of the transparent substrate as the incident exposure light propagates to the front surface of the transparent substrate.

According to another aspect of the inventive concept, the photomask or optical component is a product made by a process wherein a section of the photomask substrate is irradiated with energy which does not melt and/or vaporize the medium of the photomask substrate to form the scattering element. To this end, a femtosecond laser may be used.

BRIEF DESCRIPTION OF THE DRAWINGS

Embodiments of the inventive concept will be more clearly understood from the following detailed description thereof, taken in conjunction with the accompanying drawings in which.

DETAILED DESCRIPTION OF THE PREFERRED EMBODIMENTS

Figure 1:
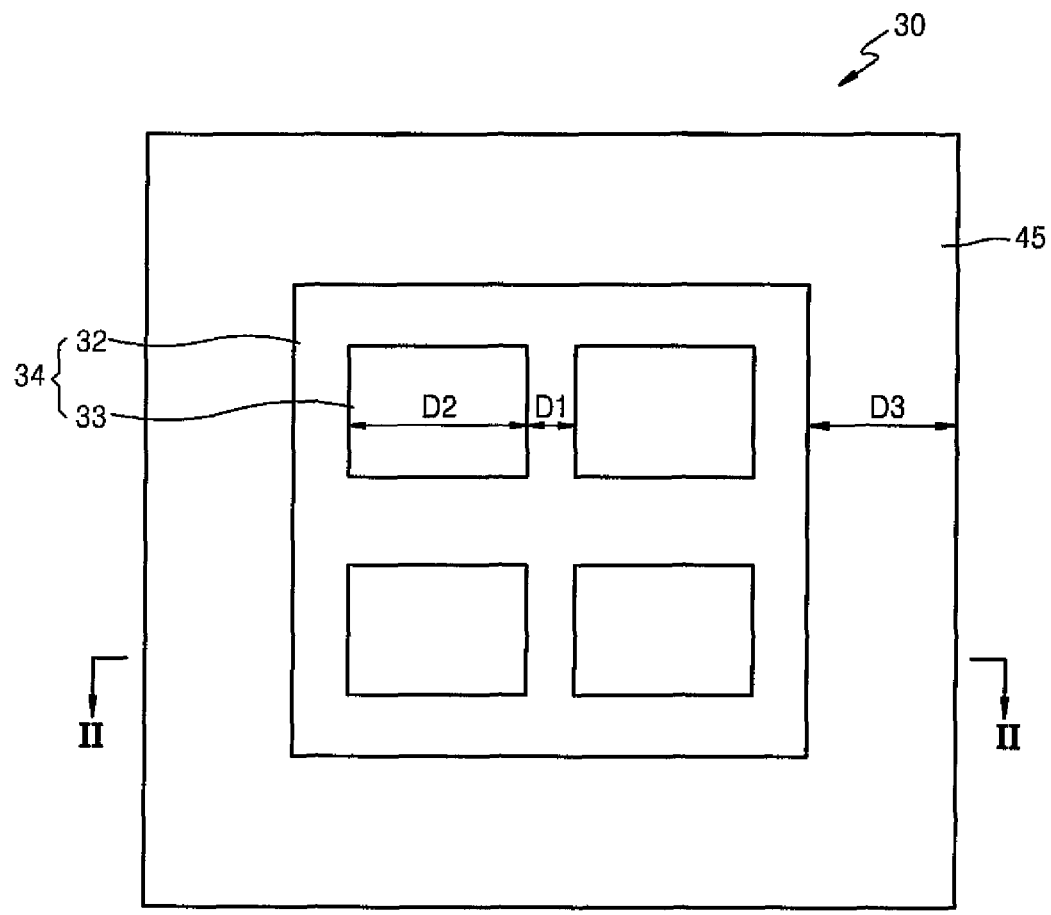
FIG. 1 is a plan view of an embodiment of a photomask, according to the inventive concept.

Embodiments of a photomask according to the inventive concept will now be described more fully with reference to the accompanying drawings. Like reference numbers are used to designate like elements throughout the drawings. Also, in the drawings, the thicknesses of layers and regions may be exaggerated for clarity. In particular, the cross-sectional views of the embodiments of the photomasks described herein (and of the intermediate structures leading up to the photomasks) are schematic in nature. Accordingly, the shape, for example, of regions of the illustrated photomasks may vary from those in practice due to manufacturing techniques and/or tolerances. Thus, the drawings should not be construed as limiting with respect to the inventive concept. Furthermore, relative spatial terms such as above, below, vertically, left and right are used throughout the specification for ease in describing the orientations of the elements/regions of photomasks. In this respect, the drawings provide the frame of reference for the relative spatial terms employed throughout the specification or at the very least allow the relative spatial terms to be put into their proper context. Thus, the use of relative spatial terms is not limiting insofar as the orientations that the various elements/regions may assume at the time of a manufacture or use, for example. Also, as is typical, the term "photomask" is used throughout the photomask to denote any of the optical components bearing a pattern whose image is to be transferred to a substrate using photolithography, i.e., the term "photomask" may also be used to denote what is considered by some in the art to be a reticle.

Figure 2:
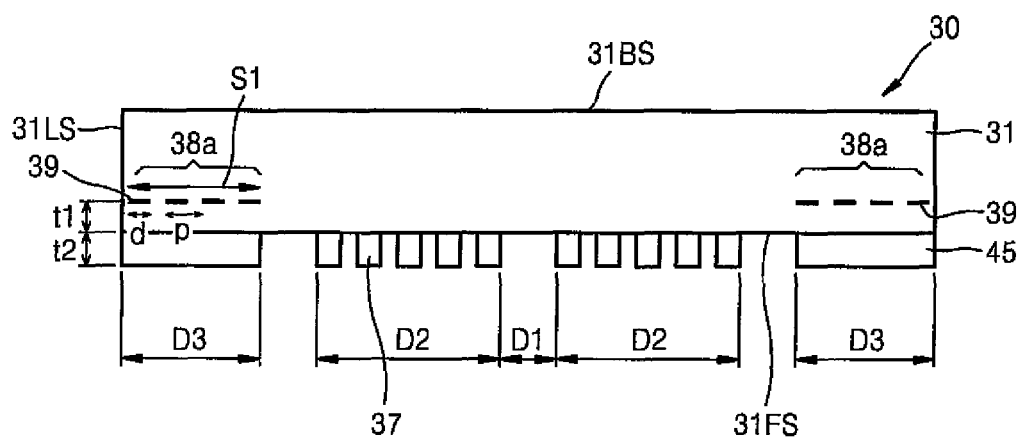
FIG. 2 is a sectional view of the photomask.

Referring to FIGS. 1 and 2, a photomask 30, according to the inventive concept, includes a photomask substrate 31 having a front surface 31FS and a back surface 31BS, mask patterns 37 on the front surface 31FS of the photomask substrate 31, and a scattering element 38a disposed within the medium of the photomask substrate 31 itself.

The photomask substrate 31 is formed of a material (i.e., the aforementioned medium) that is transparent to the exposure light that is used in the process of exposing a substrate during the manufacturing of an electronic device or the like. For example, the photomask substrate 31 is a quartz or glass substrate. (Such a substrate may be referred to hereinafter as an "electronic device substrate" to distinguish it from the photomask substrate 31). Also, the photomask substrate 31 has a chip area 34 including a peripheral circuit region 32 and a plurality of cell array regions 33.

The mask patterns 37 are confined to the chip area 34. Basically, images of the mask patterns 37 are transferred to the electronic device substrate by directing the exposure light onto a resist on the electronic device substrate via the photomask 30 and an illumination system (described later on) of the exposure equipment. In this respect, the mask patterns 37 may comprise light shielding film patterns that prevent some of the exposure light from being transmitted by the photomask 30. For example, the mask patterns 37 may be half-tone film patterns whose features block (absorb) only some of the exposure light incident thereon, or 100% shielding film patterns such as chromium patterns whose chromium features block (absorb) essentially all of the exposure light incident thereon. The mask patterns 37 may each be a combination of a light shielding film pattern, and phase shift transmittance regions which shift the phase of the exposure light transmitted therethrough. Therefore, the photomask 30 may be a phase shift mask (PSM). As is known per se in the art, such phase shift transmittance regions may be constituted by recesses in a surface of the photomask substrate 31, in which case the phase shift transmittance regions are formed by etching away portions of the photomask substrate 31.

As mentioned above, the scattering element 38a is disposed in the medium of the photomask substrate 31. That is, the scattering element 38a can be considered to be encapsulated in the medium of the photomask substrate 31 so as to be situated entirely between the front surface 31FS and a back surface 31BS of the photomask substrate 31. Exposure light that is incident on the back surface 31BS of the photomask substrate 31 and is transmitted to the mask patterns 37 is scattered and/or diffracted by the scattering element 38a, so that the intensity of the exposure light is reduced. Hence, the intensity of the illumination incident on the mask patterns 37 is less than that of the exposure light incident on the back surface 31BS of the photomask substrate 31.

The scattering element 38a does not affect the intrinsic characteristics of the medium of the photomask substrate 31 and will not in and of itself form or cause cracks to form within the photomask substrate 31. To this end, the scattering element 38a may be an array of spots 39 that are produced by irradiating the medium of the substrate 31 with energy which changes the refractive index of the medium without melting and/or vaporizing the medium.

For example, the scattering element 38a is formed using a femtosecond laser whose pulses have durations of $10^{-15}$ ms and are characterized as having a high-energy density. In general, a laser beam having an energy level of 1 mJ and pulses whose durations are on the order of less than 100 fs has an energy density of approximately $10^6$ to $10^7$ W/cm$^2$.

As a result of irradiating the photomask substrate 31 with the laser beam emitted by a femtosecond laser having the characteristics described above, avalanche photon absorption and ionization, i.e., a multi-photon phenomenon, occurs in the medium of the photomask substrate 31. According to this phenomenon, a predetermined part of the medium of the photomask substrate 31 is changed into plasma without being melted and/or vaporized. The high temperature of the plasma produces a high level of pressure which expands ions at high speed. However, the duration of the pulses is less than the time needed for a photon to transfer heat to peripheral lattice structures. Therefore, the plasma cools rapidly and a shock wave is produced between the rapidly cooled plasma and the adjacent relatively cold media. As a result, regions of the medium, corresponding to the spots 39, acquire a completely different morphology from the remainder of the medium of the photomask substrate 31. In this example, this change in morphology results in the index of refraction of the spots 39 being greater than that of the remainder of the medium of the photomask substrate 31. Thus, light passing through the spots 39 is diffracted.

In accordance with Fourier transforms for optics, if the shape of a mask pattern 37 as a function of location is f(x), a distribution of the energy field of the illumination that is transmitted by the photomask 30 and is projected onto a pupil of the illumination system is g(k)=F {f(x)}. That is, based on the shape of the mask pattern 37 the energy field distribution of the pupil can be predicted by a Fourier transform. That is, the change in the illumination may be designed for based on a Fourier transform.

The change in the illumination as provided for by the scattering element 38a will now be described in more detail. The change in the illumination with respect to the scattering element 38a may be expressed as a convolution of the illumination transmitted by the photomask if the scattering element 38a were not provided and a Fourier spectrum (a power spectrum) with respect to the scattering element 38a.

Figure 3:
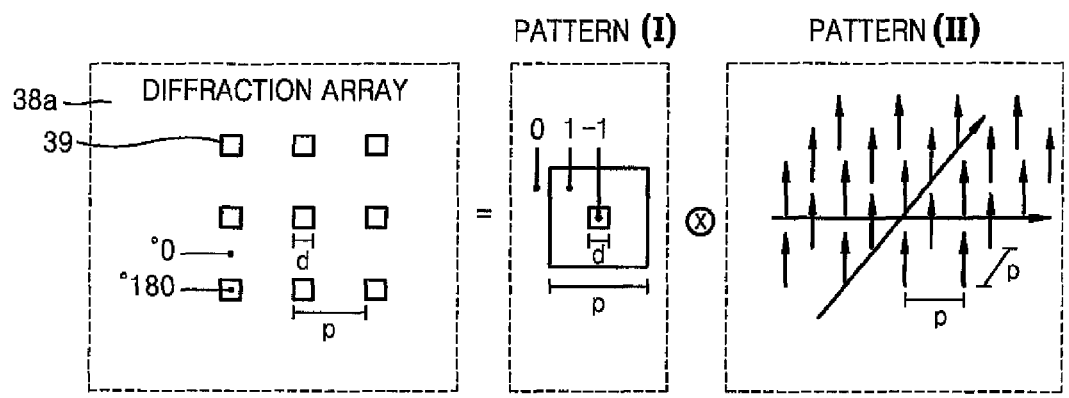
FIGS. 3 and 4 are schematic diagrams used to explain, based on Fourier optics, changes in illumination produced by a scattering element of an embodiment of a photomask according to the inventive concept.
Figure 4:
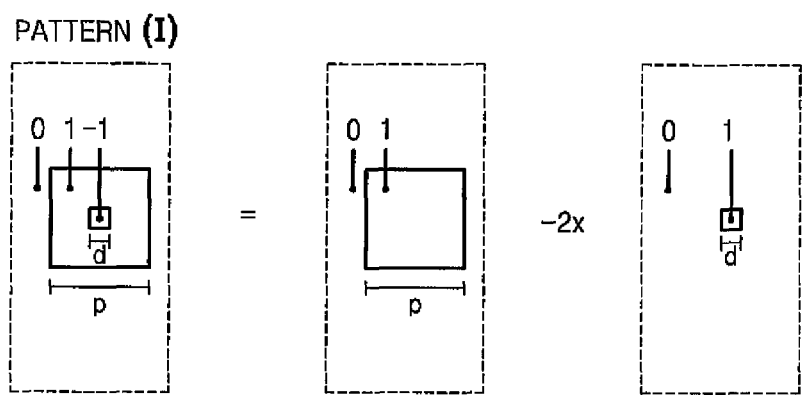

Referring to FIG. 3, if the phase of light transmitted through the spots 39 of the scattering element 38a is shifted by 180° relative to the phase of light transmitted through the remainder of the medium, the scattering element 38a may be represented as a convolution of patterns I and II. A modification of the pattern I is shown in FIG. 4. And if the spots 39 each have a diameter d and are arrayed at a pitch p, the Fourier spectrum (the power spectrum) of the illumination transmitted by the scattering element 38a can be expressed by equation 1 below.

$$E(\text{energy field}) = 1 - 2d^2/p^2 \quad (1)$$

The intensity of the transmitted illumination which is equal to the square of E (energy field) is expressed by equation 2 below.

$$I(\text{illumination intensity}) = [1 - 2d^2/p^2]^2 \approx 1 - 4d^2/p^2 \quad (2)$$

If the intensity of the illumination has no high order diffraction term and the spots 39 have a low density ($d^2/p^2$), equation 2 yields an approximation that the maximum drop in the illumination intensity is 4 times the density ($d^2/p^2$) of the spots 39. However, the high order diffraction term cannot be 0 during an actual exposure. Therefore, the drop in the illumination intensity with regard to the density ($d^2/p^2$) of the spots 39 is smaller than 4.

It can thus be concluded that the density ($d^2/p^2$) of the spots 39 needs to be increased to reduce the illumination density. The density ($d^2/p^2$) of the spots 39 may be reduced by making the diameter d of the spots smaller relative to the pitch p of the spots 39. However, the smaller the diameter d of each of the spots 39, the greater the diffraction effect and the smaller the high order diffraction term become. Also, the smaller the diameter d of each of the spots 39, the less the shape of the pupil of the illumination system changes.

Therefore, the scattering element 38 should be designed, in terms of producing a change in the illumination intensity, so that the spots 39 have the greatest pitch p and a minimum diameter d.

Referring back to FIGS. 1 and 2, the cell array regions 33 each have a second width D2 and are spaced apart from each other by a first distance D1 in a first direction. The photomask 30 also has a blind pattern 45 extending along the periphery of the photomask substrate 31. The blind pattern 45 has a width D3. More specifically, the lateral surface 31LS or edge of the photomask substrate 31 and the chip region 34 are spaced from one another by a distance D3. The scattering element 38 is juxtaposed with the blind pattern in the direction of the thickness of the photomask substrate 31. The width S1 of the scattering element 38a, namely, the dimension of the scattering element in the same direction as D1, D2 and D3, may be the same as or smaller than the width D3 of the blind pattern 45. Moreover, a first thickness t1 of the medium of the photomask substrate 31 exists between the scattering element 38a and the front surface 31FS of the photomask substrate 31. The first thickness t1 depends on the thickness t2 of the blind pattern 45 and parameters of the optical process/equipment in which the photomask 30 is used.

Figure 9:
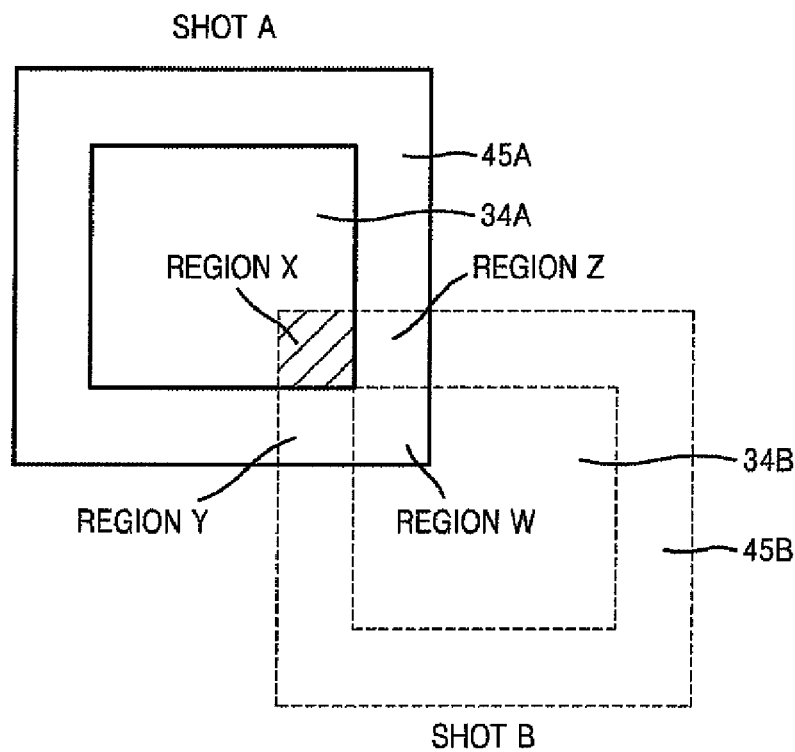
FIG. 9 is a plan view of first and second adjacent shots on a wafer.

FIG. 9 shows adjacent regions of a wafer onto which the mask patterns 37 of a photomask embodied according to the inventive concept is transferred. In particular, FIG. 9 shows first and second shots A and B formed in sequence using a wafer scanner in which the photomask is loaded, and the wafer and the photomask are moved relative to each other over increments corresponding to the shots. Referring to FIG. 9, the first shot A has a chip region 34A and a blind pattern region 45A corresponding to those regions of the photomask. The second shot B also has a chip region 34B and a blind pattern region 45B corresponding to those of the photomask. In general, regions of the wafer to which no useful pattern is transferred are minimized to increase the yield of the mass-production process.

Therefore, as can be seen in FIG. 9, the shots are produced so that the chip regions 34A and 34B of the first shot A and the second shot B contact each other. Accordingly, the first and second shots A and B have overlapping regions X, Y, W, and Z. In particular, a part of the blind pattern region 45B of the second shot B overlaps at region X a part of the chip region 34A of the first shot A.

Meanwhile, a defect referred to as Haze occurs on a photomask in a wafer scanner after the photomask has transmitted a certain amount of the exposure light during the course of forming numerous shots. Accordingly, preventive maintenance (PM) is regularly performed to eliminate the Haze and thereby prevent the photolithographic process from being degraded. As was alluded to in the Background section, the PM includes cleaning the photomask after a pellicle has been removed from the photomask. However, the thickness of the blind pattern (e.g., a ring of chromium) formed on the photomask substrate is reduced due to a frequent cleaning of the photomask during the PM. In this case, the transmittance of the photomask is reduced due to the reduction of the thickness of the blind pattern.

More specifically, assuming again that the first shot A is followed by the second shot B, the chip region 34A of the first shot A and the blind pattern region 45B of the second shot B overlap each other in the region X. If the illumination has not been completely blocked in the blind pattern region 45B of shot B due to a reduction in the thickness of the blind pattern 45 of the photomask 30, the critical dimension (CD) of the patterns in the chip region 34A of shot A may be affected by the exposure light transmitted through the blind pattern 45 of the photomask 30 when the second shot B is illuminated. Hence, there is non-uniformity in the critical dimension of the pattern formed in the chip region 45A. According to the inventive concept, the scattering element 38a is formed in the medium of the photomask substrate 31 below the blind pattern 45, and causes loss in the exposure light propagating through the photomask 30 from the back surface 31BS towards the blind pattern, thereby decreasing the transmittance of the exposure light by the blind pattern 45 in the case, for example, in which the blind pattern 45 becomes thin enough to transmit the exposure light. Accordingly, the uniformity of the shot is enhanced by a photomask embodied according to the inventive concept.

Figure 5:
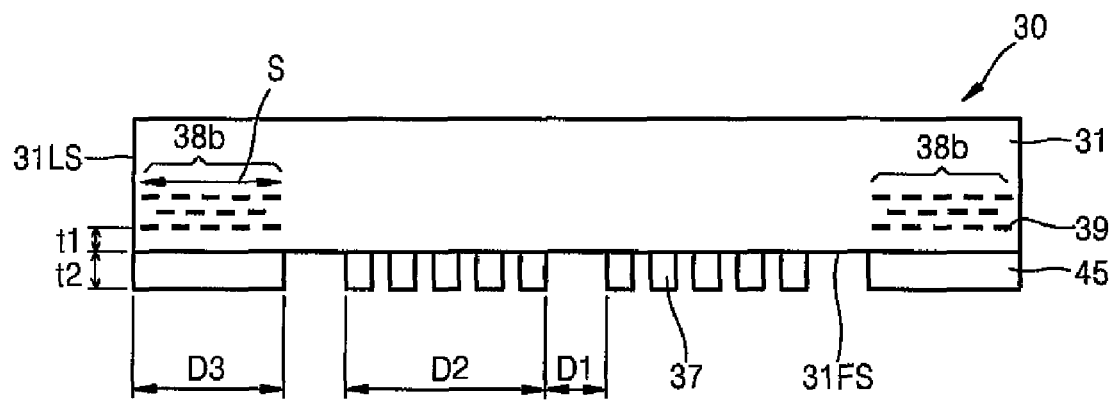
FIG. 5 is a sectional view of another embodiment of a photomask according to the inventive concept.

FIG. 5 shows of another embodiment a photomask according to the inventive concept.

Referring to FIG. 5, a scattering element 38b includes the spots 39 that are arrayed in each of three layers. However, the inventive concept is not so limited and encompasses embodiments in which the spots 39 are arrayed in each of various other numbers of layers. That is, according to the inventive concept, the scattering element 38b can have a multi-layered array of spots 39. Otherwise, the photomask 30 of the embodiment of FIG. 5 is substantially the same as that of the embodiment of FIGS. 1 and 2.

Figure 6:
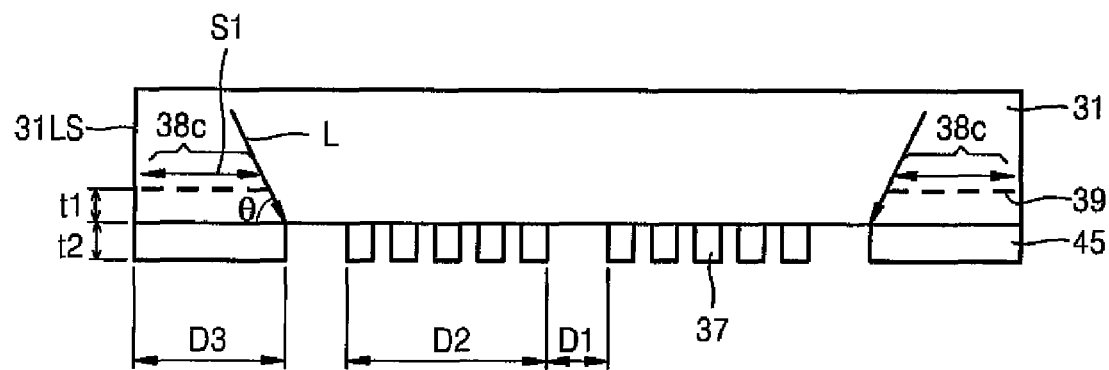
FIG. 6 is a sectional view of still of another embodiment of a photomask according to the inventive concept.

FIG. 6 shows still another embodiment of a photomask according to the inventive concept.

Referring to FIG. 6, a scattering element 38c formed in the medium of the photomask substrate 31 is configured so as to allow light rays of the exposure light L to propagate obliquely at a predetermined angle θ toward the mask patterns 37. More specifically, the length S1 of the scattering element 38c is smaller than the width D3 of the blind pattern 45, and the length S1 of the scattering element 38c and the thickness t1 of the photomask substrate 31 between the front surface 31FS of the photomask substrate 31 and the light scattering element 38c are such that the rays of the exposure light L which are incident on the photomask substrate below the blind pattern 45 and which propagate obliquely toward the mask patterns 37 will pass around the light scattering element without having their intensity reduced. In some photolithography processes, it is preferable to illuminate the light rays of the exposure light L obliquely at a predetermined angle θ toward the mask patterns in order to improve the quality of image transferred to a substrate of a device being manufactured by using the photomask in the photolithography process.

Note, embodiments of the photomask have been described above with reference to FIGS. 2, 5, and 6, as each having a particular scattering element 38a, 38b, and 38c but the inventive concept is not limited thereto. Rather, a photomask 30 embodied according to the inventive concept may have a scattering element that combines the effects of the scattering elements 38a, 38b, and 38c shown in FIGS. 2, 5, and 6. To be more specific, in another example of a photomask according to the inventive concept, the scattering element is made up of spots arrayed in each of multiple layers (as in the embodiment of FIG. 5), and spots configured so oblique rays of the exposure light can be incident on the mask patterns 37 (as per the embodiment of FIG. 6).

Furthermore, in each of the embodiments of a photomask according to the inventive concept as described above with reference to FIGS. 2, 5, and 6, the scattering element is uniform across the photomask substrate 31, that is, up and down and to the left and right in the figures. However, the inventive concept is not so limited.

Figure 10:
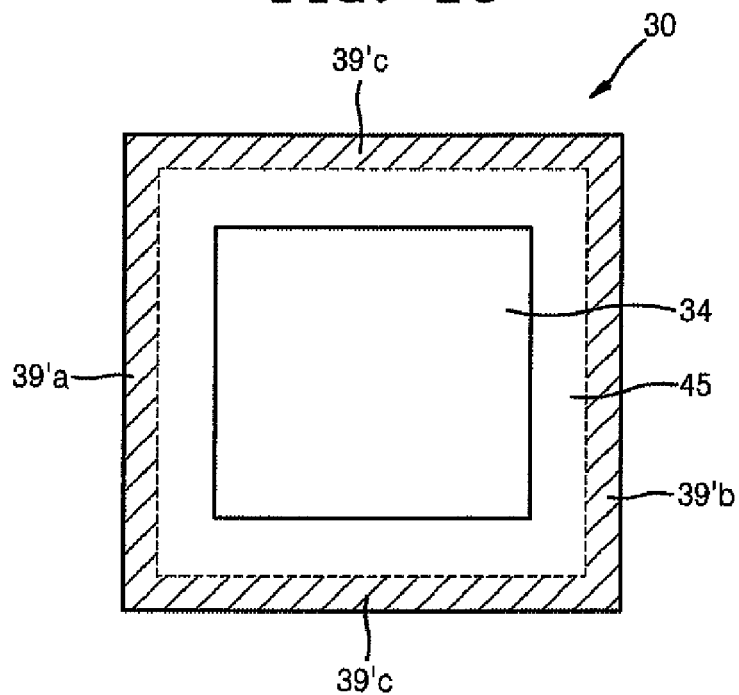
FIG. 10 shows a plan view of a photomask according to another exemplary embodiment.

FIG. 10 shows a plan view of a photomask according to another exemplary embodiment.

Referring to FIG. 10, the chip region 34 including a cell array region and a peripheral circuit region is located at the center of the photomask 30. The blind pattern 45 has a predetermined width (D3) and extends along the periphery of the photomask substrate (31 in FIG. 2). The region shaded by oblique lines is a region occupied by the spots 39'a to 39'c of the scattering element. In an example of an embodiment of a photomask according to the inventive concept, the spots 39'a (the spots 39 of a scattering element 38a of the type shown in and described with reference to FIG. 2) are disposed in the left hand portion of the photomask substrate 31, the spots 39'b (the spots 39 of a scattering element 38b of the type shown in and described with reference to FIG. 5) are disposed in the right hand portion of the photomask substrate 31, and the spots 39'c (the spots 39 of a scattering element 38c of the type shown in FIG. 6) are disposed in the upper and lower portion of the photomask substrate 31.

Figure 7:
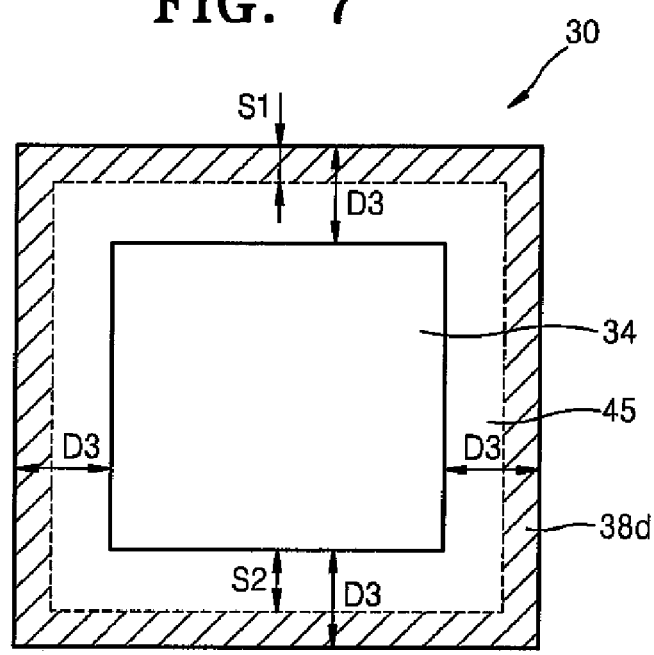
FIG. 7 is a plan view of one basic form of a photomask according to the inventive concept.

FIG. 7 shows a basic form that a photomask 30 may take according to the inventive concept.

Referring to FIG. 7, the chip area 34 including a cell array region and a peripheral circuit region is located at the center of the photomask 30. The blind pattern 45 has a predetermined width (D3) and extends along the periphery of the photomask substrate (31 in FIG.2). The region shaded by oblique lines is a region occupied by the scattering element 38d. Thus, the scattering element 38d is situated 38e in the medium of the photomask substrate below the blind pattern 45. The region where the scattering element 38d is not present below the blind pattern 45 has a width S2. In some embodiments, the width S1 of the scattering element 38d is smaller than the width D3 of the blind pattern 45 (D3=S1+S2). However, the precise width S1 of the scattering element 38d depends on various conditions or parameters of the process in which the photomask is being used. Thus, in some embodiments, the width S1 of the scattering element 38d is the same as the width D3 of the blind pattern 45 (S2 is 0).

Figure 8:
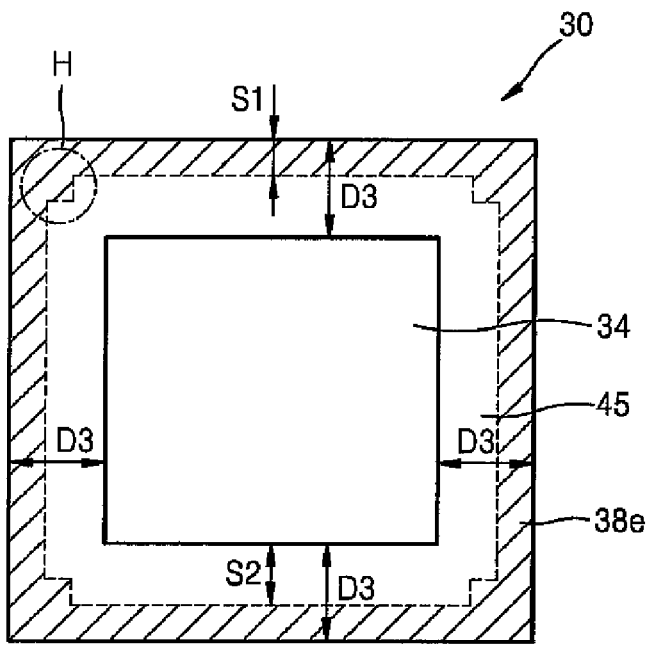
FIG. 8 is a plan view of another basic form of a photomask according to the inventive concept.

FIG. 8 is a plan view of another example of the basic form of a photomask embodied according to the inventive concept.

Referring to FIG. 8, the blind pattern 45 has a predetermined width D3 and extends along the periphery of the photomask substrate (31 in FIG. 2). The region shaded by oblique lines is a region occupied by the scattering element 38e. Thus, the scattering element 38e is situated in the medium of the photomask substrate below the blind pattern 45. The width S1 of the scattering element 38e may be the same as or smaller than the width D3 of the blind pattern 45. However, the scattering element 38e has a scattering section H that protrudes from the band of the scattering element having width S1, at a corner of the photomask substrate, toward the chip region 34. For example, the scattering element H corresponds to the region W of the second shot B in FIG. 9. Also, and as shown in FIG. 8, the scattering element 38e can include a respective scattering section H at each corner of the photomask substrate.

As described above, a photomask or equivalent optical component according to the inventive concept has a scattering element encapsulated in a substrate medium, and configured to adjust/filter the intensity, shape, and/or components of light that is incident onto the back surface of the substrate and propagates through the substrate. In particular, the scattering element may be configured to reduce the transmittance and intensity of exposure light that propagates towards the blind pattern. The intensity distribution of the light may be easily designed for by selecting a particular density of the spots making up the scattering element.

The photomask or equivalent optical component according to the inventive concept may thus be used to manufacture various electronic devices which require precise patterns, examples of which include a central processing unit (CPU), a digital signal processor (DSP), a processor combining a CPU and a DSP, an application specific integrated circuit (ASIC), a microelectromechanical (MEM) device, an optoelectronic device, and a display device such as an LCD.

Finally, embodiments of the inventive concept have been described herein in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A photomask comprising:
    a photomask substrate having a front surface and a back surface and transparent to exposure light of a given wavelength;
    at least one mask pattern on the front surface of the photomask substrate and whose image is to be transferred to a substrate of a device being manufactured by using the photomask in a photolithography process;
    a blind pattern on the front surface of the photomask substrate, extending along only the periphery of the photomask substrate, and opaque to the exposure light; and
    a light scattering element encapsulated in the medium of the photomask substrate, juxtaposed with the blind pattern in the direction of the thickness of the photomask substrate, and configured to modify the exposure light that is incident on the back surface of the photomask as the incident exposure light propagates to the front surface of the photomask.

2. The photomask of claim 1, wherein the light scattering element comprises an array of spots of material whose index of refraction is different from that of the medium of the photomask substrate.

3. The photomask of claim 1, wherein the scattering element comprises an array of spots each of a diameter d and spaced from one another at a pitch p, and a function of the density of the spots, in terms of the diameter d and pitch p of the spots, is proportional to a drop in intensity of the exposure light transmitted from the back surface of the photomask substrate to the front surface thereof via the scattering element.

4. The photomask of claim 1, wherein the scattering element comprises arrays of spots in each of multiple layers spaced from one another in a direction between the back surface of the photomask substrate and the front surface of the photomask substrate.

5. The photomask of claim 1 wherein the scattering element comprises spots of two or more different shapes.

6. The photomask of claim 1, wherein the scattering element comprises an array of spots configured to allow rays of light incident on the back surface of the substrate below the scattering element to propagate obliquely towards the at least one mask pattern on the front surface of the photomask substrate.

7. The photomask of claim 1, wherein the photomask substrate is rectangular and has a chip region at the center thereof, the at least one pattern is located in the chip region, and the scattering element has a section that protrudes, at a corner of the photomask substrate toward the center of the photomask substrate.

8. The photomask of claim 1, wherein the width of the scattering element, in the plane of the transparent substrate, is equal to or smaller than that of the blind pattern.

9. The photomask of claim 1, and wherein the scattering element is made by a process of irradiating a section of the photomask substrate with radiant energy which does not melt and/or vaporize the medium of the photomask substrate.

10. The photomask of claim 9, and wherein the scattering element is made by a process of irradiating said section of the photomask substrate with radiant energy emitted by a femtosecond laser.

11. An optical component of photolithographic exposure equipment, comprising:
a substrate having a front surface and a back surface and transparent to exposure light of a given wavelength;
at least one mask pattern adjacent the front surface of the transparent substrate and whose image is to be transferred to a substrate of a device being manufactured by using the photolithographic exposure equipment;
a blind pattern adjacent the front surface of the transparent substrate, extending alongside only an outer peripheral part of the optical component, and opaque to the exposure light; and
a light scattering element encapsulated in the medium of the transparent substrate, juxtaposed with the blind pattern in the direction of the thickness of the transparent substrate, and configured to modify the exposure light that is incident on the back surface of the transparent substrate as the incident exposure light propagates to the front surface of the transparent substrate.

12. The optical component of claim 11, wherein the light scattering element comprises an array of spots of material whose index of refraction is different from that of the medium of the transparent substrate.

13. The optical component of claim 11, wherein the transparent substrate is rectangular, the scattering element has one section that extends alongside the respective sides of the transparent substrate, and another section that protrudes, at a corner of the transparent substrate, from said one section toward the center of the transparent substrate.

14. The optical component of claim 11, wherein the width of the scattering element, in the plane of the transparent substrate, is equal to or smaller than that of the blind pattern.

15. The optical component of claim 11, and wherein the scattering element is made by a process of irradiating a section of the transparent substrate with radiant energy which does not melt and/or vaporize the medium of the transparent substrate.

16. The optical component of claim 15, and wherein the scattering element is made by a process of irradiating said section of the transparent substrate with radiant energy emitted by a femtosecond laser.

17. A lithography mask comprising:
a mask substrate having a front surface and a back surface and of a medium transparent to exposure light of a given wavelength,
the front surface having a chip area situated in a central portion of the mask substrate, and a peripheral area surrounding the chip area and situated in an outer peripheral portion of the mask substrate;
at least one mask pattern defined at and confined to the chip area of the front surface of the mask substrate, and whose image is to be transferred to a substrate of a device being manufactured by using the mask in a lithography process;
a blind pattern disposed on the front surface of the mask substrate and extending only along the peripheral portion of the mask substrate, boundaries of the blind pattern coinciding with those of the peripheral area of the front surface of the mask substrate, and wherein the blind pattern is opaque to exposure light of the given wavelength as long as the blind pattern has at least a certain thickness; and
a light scattering element encapsulated in the medium of the mask substrate, confined to the outer peripheral portion of the mask substrate as juxtaposed with the blind pattern in the direction of the thickness of the photomask substrate, and configured to reduce the intensity of the exposure light of the given wavelength when the exposure light is propagating through the peripheral portion of the substrate, and
wherein exposure light of the given wavelength that is incident on the mask is prevented by the blind pattern from being transmitted by the mask at the peripheral portion of the mask substrate as long as the thickness of the blind pattern remains at least equal to said certain thickness, and
when the thickness of the blind pattern becomes less than said certain thickness such that exposure light of the given wavelength that is incident on the mask is at least partially transmitted by the blind pattern, the light scattering element will modify the light transmitted by the mask at the peripheral portion of the mask substrate.

18. The lithography mask of claim 17, wherein the light scattering element comprises spots of material whose index of refraction is different from that of the medium of the transparent substrate, the spots being arranged in at least one array in which the spots are spaced from one another in the plane of the mask substrate.

19. The lithography mask of claim 18, and made by a process wherein the outer peripheral portion of the mask substrate is irradiated with radiant energy which does not melt and/or vaporize the medium of the mask substrate to thereby form the scattering element.

20. The photomask of claim 19, and made by a process wherein a the peripheral portion of the mask substrate is irradiated with pulses of the radiant energy emitted by a femtosecond laser.

* * * * *